United States Patent [19]

Sekel et al.

[11] 4,438,498
[45] Mar. 20, 1984

[54] POWER SUPPLY OUTPUT MONITORING METHOD AND APPARATUS

[75] Inventors: Stephen M. Sekel, Beaverton; Rodney G. Strange, Aloha; Robert F. Verrinder, Beaverton, all of Oreg.

[73] Assignee: Tektronix, Inc., Beaverton, Oreg.

[21] Appl. No.: 282,476

[22] Filed: Jul. 13, 1981

[51] Int. Cl.³ .............................. G05F 1/02
[52] U.S. Cl. ................... 364/483; 324/158 R; 323/283
[58] Field of Search ............... 364/483; 324/119, 120, 324/115, 158 R; 323/283, 282, 265, 273; 307/150, 43, 52, 60, 57

[56] References Cited

U.S. PATENT DOCUMENTS

| | | | |
|---|---|---|---|
| 3,605,002 | 9/1971 | Smyth | 307/150 X |
| 4,037,156 | 7/1977 | Goujon et al. | 324/158 R |
| 4,128,771 | 12/1978 | Domenico | 323/283 X |
| 4,229,665 | 10/1980 | Tiedt | 307/150 |
| 4,333,049 | 6/1982 | Yui et al. | 324/158 R X |

OTHER PUBLICATIONS

Design Considerations for a Field-Service Digital Multimeter, Control and Instrumentation, vol. 9, No. 9, Oct. 1977.

*Primary Examiner*—Edward J. Wise
*Attorney, Agent, or Firm*—George T. Noe

[57] ABSTRACT

An output monitoring method and apparatus is provided for a programmable power supply in which the supply produces one of a programmed voltage or current value and the appropriate value is displayed on a single display device.

10 Claims, 2 Drawing Figures

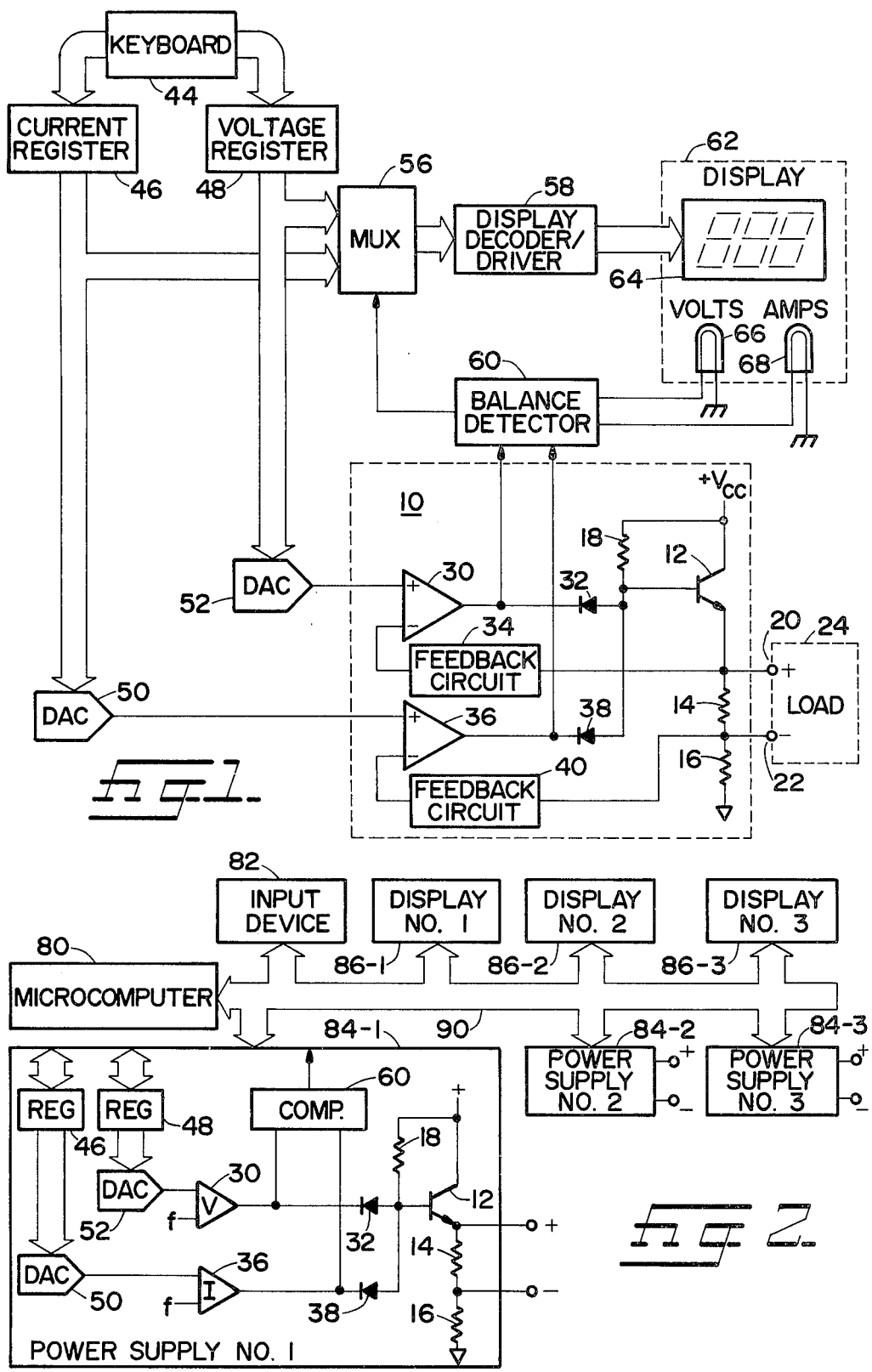

4,438,498

POWER SUPPLY OUTPUT MONITORING METHOD AND APPARATUS

BACKGROUND OF THE INVENTION

The present invention relates generally to electronic measurement and display apparatus, and in particular to a method and apparatus for simulating voltage and current measurements and displaying the results in a single digital display.

The conventional method of monitoring the output voltage and current values of an electronic power supply apparatus is simply by using external digital multimeters or the like to provide the measurement and display. More sophisticated precision power supplies have digital multimeters built in so as to provide a continuous monitoring and display of the output values. In both instances, two meters are required for each supply in order to measure both voltage and current. It is particularly desirable to have such continuous monitoring in an auto crossover power supply because the output switches automatically from a voltage-supplying mode to a current-supplying mode, and vice versa, under certain conditions of the load, such as the impedance changing in a dynamic fashion or malfunctions and fault occurrences. However, the inclusion of digital multimeters is not attractive in terms of space requirements, power consumption, and cost.

SUMMARY OF THE INVENTION

In accordance with the present invention, an output monitoring method and apparatus is provided for a programmable power supply in which independently programmed voltage-limit or current-limit values are displayed, wherein the parameter (voltage or current) for display is chosen in accordance with the balanced and unbalanced states of certain feedback loops within the power supply.

The present invention is embodied in a constant-voltage, constant-current regulated power supply with auto crossover from one output mode to the other. The power supply regulator comprises two separate control loops—one for constant-voltage operation and one for constant-current operation. Each loop includes an error amplifier with negative feedback which when balanced establishes the power supply output at a level equal to a programmable reference signal. The regulator is arranged such that only one loop can be balanced at a time, and by detecting which of the constant-voltage or constant-current loops is balanced, the appropriate actual programmed value may be decoded and displayed by a single alpha-numeric display device with the proper indication of volts or amperes. The monitoring function may be implemented either in hardware or under microprocessor control.

It is therefore one object of the present invention to provide a power supply output monitoring method and apparatus which simulates the measurement and display functions of digital multimeters without the attendant bulk and power consumption and high cost.

It is another object of the present invention to provide a novel method of continuously monitoring a constant-voltage, constant-current regulated power supply with auto crossover.

Other objects and advantages of the present invention will become apparent to those having ordinary skill in the art upon a reading of the following description when taken in conjunction with the accompanying drawings.

DRAWINGS

FIG. 1 is a block diagram of one embodiment of the present invention; and

FIG. 2 is a block diagram of a microcomputer-based implementation of the present invention.

DETAILED DESCRIPTION OF THE INVENTION

There is shown in the lower portion of FIG. 1 a constant-voltage, constant-current regulated power supply 10 with the auto crossover from one output mode to the other in which it is desired to monitor the output not only in terms of the amount of voltage or current being supplied, but in terms of which operating mode—voltage or current—the power supply is in. The power supply 10, shown generally enclosed by dashed lines, comprises the well-known configuration of a series-pass transistor connected between a suitable source of positive supply voltage $+V_{cc}$ and a reference potential, such as ground, through the serial connection of a high-impedance resistor 14 and a low-impedance current-sensing resistor 16. A suitable biasing resistor 18 is connected from the base of transistor 12 to the positive supply. A pair of output terminals 20 and 22, designated + and —, respectively, are provided at opposite ends of resistor 14 to which a load 24, represented by a dashed-line box, may be connected. The conduction of series-pass transistor is regulated by one of two separate control loops—one for constant-voltage operation and one for constant-current operation. The constant-voltage regulation control loop comprises an error amplifier 30, the output of which is connected through a diode 32 to the base of transistor 12, and a feedback network coupled from the + output terminal 20 (and hence the emitter of transistor 12) to the inverting input of amplifier 30. The constant-current regulation control loop comprises an error amplifier 36, the output of which is connected through a diode 38 to the base of transistor 12, and a feedback network 40 coupled from the — output terminal 22 to the inverting input of amplifier 36.

In operation, diodes 32 and 38 form an OR gate so that only one control loop may be balanced at any given time and thus regulate the conduction of transistor 12, while the other control loop is unbalanced. The particular state of balance is determined by the reference voltages applied to the non-inverting inputs of amplifiers 30 and 36, and by the load impedance connected between the output terminals, as will be explained later.

Desired operating current and voltage values are entered into a keyboard 44 to provide manually programmed reference voltages for the error amplifiers 30 and 36. The keyboard 44 generates digital words representative of the programmed values, and stores these digital words in a respective pair of registers 46 and 48. Register 46 contains digital word corresponding to the programmed current limit value, and this value is converted to an analog voltage by a digital-to-analog converter (DAC) 50 to be applied as a reference voltage to the non-inverting input of amplifier 36. Register 48 contains the digital word corresponding to the programmed voltage limit value, and this value is converted to an analog voltage by DAC 52 to be applied as a reference voltage to the non-inverting input of amplifier 30. The digital words stored in registers 46 and 48 are also applied to a multiplexer (MUX) 56 to be routed to a display decoder and driver unit 58 in accordance with a control logic signal from a balance detector 60 connected to the outputs of amplifiers 30 and 36. A display device 62 includes an LED display unit 64 for displaying the numerical value of the programmed current or voltage, and a pair of lamps 66 and 68, only one of which may be lit at any given time, to indicate either volts or amps, respectfully.

In the constant-voltage mode, the load inpedance across output terminals 20 and 22 is high enough that the voltage drop thereacross is significant while the voltage drop across resistor 16 is negligible. Therefore, the constant-voltage control loop becomes balanced as the inverting input of amplifier 30 matches the programmed reference voltage applied to the non-inverting input thereof in accordance with conventional operational amplifier action, and the voltage at output terminal 20 is that which is represented by the digital word stored in register 48. Meanwhile, with the inverting input of amplifier 36 substantially grounded, the constant-current control loop is unbalanced. The balance detector 60, which may suitably include a comparator, detects the balanced condition of amplifier 30 and simultaneously lights the VOLTS lamp 66 and routes the contents of register 48 through MUX 56 to the display decoder and driver unit to be converted to a numerical display by the LED display unit 64.

Now, suppose that load impedance decreases so that additional current is forced through resistor 16, increasing the voltage drop thereacross and at the same time decreasing the voltage at output terminal 20, causing the constant-voltage control loop to become unbalanced, in turn causing balance detector 60 to turn off the VOLTS lamp 66. Eventually the voltage at output terminal 22 rises to a point at which the voltage at the inverting input of amplifier 36 matches the programmed reference voltage at the non-inverting input thereof, and the constant-current control loop becomes balanced. Diode 38 conducts, pulling the base of series-pass transistor sufficiently negative to reduce the current to the load to the value represented by the digital word stored in register 46. The balance detector 60 turns on the AMPS light 68 and simultaneously applies a control logic signal to MUX 56 to route the digital word stored in register 46 to the display decoder and driver unit 58 to thereby display the programmed current value on the LED display unit 64.

From the foregoing description, it can be appreciated that the power supply is capable of automatically converting back and forth between constant-voltage and constant-current operating modes with changes in the load impedance, and further, that the actual limit values of voltage and current supplied may be programmed and displayed to thereby monitor the appropriate operating mode and output values. An additional operating mode may be provided by causing the VOLTS and AMPS lamps 66 and 68, respectively, to blink during transition periods of the power supply during with both control loops are unbalanced to obviate an untrue indication of operating mode.

FIG. 2 shows a block diagram of a completely automated digitally programmable power supply system in which a microcomputer 80, an input device 82, and one or more power supplies 84 and their associated display units 86 are interconnected by a bus 90. Power supplies 84-1, 84-3, and 84-2 are identical. The details of power supply 84-1 are shown as being similar to those set forth in FIG. 1, and like reference numerals are used to facilitate understanding. The display units 86-1, 86-2, and 86-3 may suitably be a combination of the display decoder and driver unit 58 and display device 62 of FIG. 1. The operation of the power supplies and display units is substantially as described hereinabove, with the microcomputer 80 providing interaction with the components to provide greater flexibility. Furthermore, the input device 82 may be a keyboard, or a tape or card reader, or any other device for entering digital data representative of the programmed voltage and current limits for the power supplies.

While we have shown and described a power supply monitoring method and apparatus in accordance with our invention, it will become obvious to those having ordinary skill in the art that many changes and modifications may be made without departing from the invention in its broader aspects. Accordingly, it is contemplated that the appended claims will be interpreted to cover any such modifications or embodiments as fall within the true scope of the invention.

What we claim as our invention is:

1. In the power supply having a pair of control circuits for providing voltage-supplying and current-supplying operating modes, a power supply output monitoring method, comprising the steps of:
  (a) providing digital numbers representative of power supply output voltage and current limit values;
  (b) producing in one of said pair of control circuits one of the voltage and current limit values in accordance with said digital numbers, wherein the control circuit producing the limit value is balanced and the other control circuit is unbalanced;
  (c) detecting which one of said pair of control circuits is balanced; and
  (d) providing a digital number to a display device in accordance with the detected balance control circuit, wherein the displayed digital number is proportional to the particular limit value being produced.

2. In a power supply having a pair of control circuits for providing voltage-supplying and current-supplying operating modes, a power supply monitoring apparatus, comprising:
  means for providing digital numbers representative of power supply voltage and current limit values;
  means for producing in one of said pair of control circuits one of the voltage and current limit values in accordance with said digital numbers, wherein the control circuit producing the limit value is in a balanced state while the other control circuit is in an unbalanced state;
  means for detecting which one of said pair of control circuits is in a balanced state; and
  means for providing a digital number to a display device in accordance with the detected balanced control circuit, wherein the displayed digital number is proportional to the particular limit value being produced.

3. An apparatus in accordance with claim 2 wherein said means for providing digital numbers includes programming means and a least one digital register.

4. An apparatus in accordance with claim 3 wherein said programming means comprises an input device including a keyboard.

5. An apparatus in accordance with claim 2 wherein said means for producing said limit values comprises a power supply regulator having a single output, and said control circuits comprise feedback control loops responsive to changes in output impedance to determine which loop is in a balanced state.

6. An apparatus in accordance with claim 5 wherein said detecting means comprises a comparator having an input connected to each of said pair of control loops.

7. An apparatus in accordance with claim 2 wherein said means for providing a digital number to a display device comprises a multiplexer responsive to said detecting means.

8. An apparatus in accordance with claim 2 wherein said display device includes an alpha-numeric display and separate voltage and current indicators, wherein said indicators are responsive to the output of said detecting means.

9. A power supply output monitoring apparatus, comprising:
  means for providing digital numbers representative of voltage and current limit values;
  a plurality of power supplies operable in voltage-supplying and current-supplying operating modes, each independently programmable with a selected voltage and current limit value;
  a plurality of display devices, each being associated with a respective power supply;
  means associated with each power supply for detecting the operating mode thereof from one of said voltage-supplying and current-supplying operating modes; and
  control means for transferring selected digital numbers to said display devices in accordance with the detected operating mode of each respective power supply.

10. A monitoring apparatus in accordance with claim 9 wherein said control means comprises a microcomputer.

* * * * *